US005413899A

United States Patent [19]

Scheler et al.

[11] Patent Number: 5,413,899

[45] Date of Patent: May 9, 1995

[54] LIGHT-SENSITIVE MIXTURE CONTAINING AN 0-NAPHTHOQUINONEDIAZIDE-SULFONIC ACID ESTER AND RECORDING MATERIAL PRODUCED THEREWITH WHEREIN THE 0-NAPHTHOQUINONE DIAZIDES ARE PARTIAL ESTERS

[75] Inventors: Siegfried Scheler, Wiesbaden-Naurod; Andreas Elsaesser, Idstein; Gerhard Buhr, Koenigstein; Klaus Bergmann, Mainz-Bretzenheim; Wolfgang Zahn, Eltville, all of Germany

[73] Assignee: Hoechst Aktiengesellschaft, Frankfurt am Main, Germany

[21] Appl. No.: 254,500

[22] Filed: Jun. 6, 1994

Related U.S. Application Data

[63] Continuation of Ser. No. 974,999, Nov. 12, 1992, abandoned.

[30] Foreign Application Priority Data

Nov. 13, 1991 [DE] Germany ........................ 41 37 325.1

[51] Int. Cl.$^6$ .......................... G03F 7/021; G03F 7/30

[52] U.S. Cl. .................................... 430/326; 430/165; 430/192; 430/193; 430/302

[58] Field of Search ............... 430/192, 193, 165, 302, 430/326

[56] References Cited

U.S. PATENT DOCUMENTS

| | | | |
|---|---|---|---|
| 3,802,885 | 4/1974 | Lawson et al. | 96/75 |
| 4,407,926 | 10/1983 | Stahlhofen | 430/165 |
| 5,087,598 | 2/1992 | Hosaka et al. | 430/192 |
| 5,089,373 | 2/1992 | Uenishi et al. | 430/191 |
| 5,153,096 | 10/1992 | Uenishi et al. | 534/557 |
| 5,173,389 | 12/1992 | Uenishi et al. | 430/192 |
| 5,225,310 | 7/1993 | Stahlhofen et al. | 430/192 |

FOREIGN PATENT DOCUMENTS

| | | |
|---|---|---|
| 440238 | 8/1991 | European Pat. Off. . |
| 0488712 | 3/1992 | European Pat. Off. . |
| 1-309052 | 12/1989 | Japan . |
| 739654 | 11/1955 | United Kingdom . |
| 935250 | 8/1963 | United Kingdom . |

*Primary Examiner*—Charles L. Bowers, Jr.
*Assistant Examiner*—John S. Chu
*Attorney, Agent, or Firm*—Foley & Lardner

[57] ABSTRACT

A light-sensitive mixture which contains a resinous binder which is insoluble in water but soluble or at least swellable in aqueous-alkaline solutions, and an o-naphthoquinonediazide-sulfonic acid ester, the o-naphthoquinonediazide-sulfonic acid ester being of the formula I (I)

in which

R is hydrogen or an alkyl or aryl radical and $R_1$ is hydrogen or a 1,2-naphthoquinone-2-diazide-4-sulfonyl, 1,2-naphthoquinone-2-diazide-5-sulfonyl or 7-methoxy-1,2-naphthoquinone-2-diazide-4-sulfonyl radical, and the number of the identical or different naphthoquinonediazide-sulfonyl radicals, defined as $R_1$, in the molecule being 1 to 5; is useful in the preparation of light-sensitive resist materials. The resist material produced using the light-sensitive mixture has a high light sensitivity and very good developer resistance to alkaline developers and can be developed without any problems with aqueous, weakly alkaline solutions.

23 Claims, No Drawings

LIGHT-SENSITIVE MIXTURE CONTAINING AN 0-NAPHTHOQUINONEDIAZIDE-SULFONIC ACID ESTER AND RECORDING MATERIAL PRODUCED THEREWITH WHEREIN THE 0-NAPHTHOQUINONE DIAZIDES ARE PARTIAL ESTERS

This application is a continuation of application Ser. No. 07/974,999, filed Nov. 12, 1992, now abandoned.

BACKGROUND OF THE INVENTION

1. Field of the Invention

The invention relates to a positive-working light-sensitive mixture containing a resinous binder that is insoluble in water but soluble or at least swellable in aqueous-alkaline solutions, and, as a light-sensitive compound, an o-naphthoquinonediazide-sulfonic acid ester of a diacylhexahydroxydiphenylmethane. The mixture is useful for the production of light-sensitive materials, for example, planographic printing plates and photoresists.

2. Description of Related Art

Diacylhexahydroxydiphenylmethane which is completely esterified with 1,2-naphthoquinone-2-diazide-4-sulfonic acid or 1,2-naphthoquinone-2-diazide-5-sulfonic acid is known from EP-52,788 (which is equivalent to U.S. Pat. No. 4,407,926) as a light-sensitive compound. The printing plates produced with these compounds have a light sensitivity which is adequate in practice, and an improved resistance to alkaline developers and to those organic solvents which are normally used during the copying work and during the printing process on the printing presses.

A disadvantage of these compounds is that their solubility in organic solvents such as, for example, glycol monoethers such as glycol monomethyl, monoethyl or monopropyl ether; carboxylic acid esters such as ethylacetate or butylacetate, ketones such as methyl ethyl ketone, cyclopentanone or cyclohexanone; and also aromatic hydrocarbons such as toluene or xylene, used for coating metal bases or plastic bases, is inadequate for some purposes. A further disadvantage is that resist layers containing these compounds as light-sensitive components, can, in the exposed state, be rapidly developed only with relatively strong aqueous-alkaline solutions. Such resist layers cannot be developed at an adequate speed, appropriate in practice, with the aqueous, weakly alkaline developers which are presently increasingly preferred for ecological reasons.

DE-C 938,233 (equivalent to GB-A 739,654) and U.S. Pat. No. 3,802,885, describe di- or trihydroxybenzophenones partially or completely esterified with o-naphthoquinonediazide-sulfonic acids as light sensitive compounds. These compounds readily dissolve in the conventional solvents used for coating metallic or non-metallic base materials and show a relatively high light sensitivity. Exposed resist layers of these compounds together with binders soluble in aqueous-alkaline media, for example, novolaks, can also be developed with aqueous, weakly alkaline solutions. As a rule, however, the resist layers show an inadequate developer resistance of the unexposed layer constituents. In addition, these layers are attacked to a greater or lesser extent during the printing process if alcohol-containing fountain solutions are used. The alcohol resistance of such layers is therefore in many cases inadequate for use in practice.

Further esters of o-naphthoquinonediazide-sulfonic acids and aromatic polyhydroxy compounds are known from DEC 1,118,606 (equivalent to GB-A 935,250). Inter alia, derivatives of diphenylmethane are also mentioned as phenolic components. The polyhydroxydiphenylmethane derivatives are, however, not completely esterified, so that they still contain at least one free hydroxyl group. Compounds of this type are not sufficiently soluble for some purposes in the solvents conventional for coating base materials. Their light sensitivity is generally adequate for use in practice, but the alcohol resistance of the light-sensitive resist layers produced with such compounds is not. Industrial use of these compounds is therefore possible only with severe restrictions.

EP-A 0,440,238 describes a photoresist mixture which, in addition to a polymer soluble in aqueous-alkaline solutions, contains aromatic polyhydroxy compounds which are partially esterified with 1,2-naphthoquinone-2-diazide-4-sulfonic or -5-sulfonic acid. The mixture can also contain up to 30% by weight of completely esterified polyhydroxy compounds. The aromatic polyhydroxy compounds are accessible only via a complicated reaction sequence. In contrast, the phenolic base compounds previously described, which form the starting point of the present invention, are already known and are easily accessible.

SUMMARY OF THE INVENTION

It is therefore an object of the invention to provide a light-sensitive, positive-working mixture containing an o-naphthoquinonediazide-sulfonic acid ester as light-sensitive compound which is at least comparable in its copying properties and printing properties with the best mixtures of this type hitherto known. The total of the properties of the layers produced with the mixture should, in the printing sector, be superior to the hitherto known mixtures with respect to light sensitivity, developability with aqueous, weakly alkaline solutions and alcohol resistance of the unexposed layer constituents. With respect to their light sensitivity, development with pure tetramethylammonium hydroxide solutions without leaving a residue, and enhanced thermal stability of the developed resist structures, photoresist layers produced with these mixtures should be particularly advantageously distinguished as compared with industrially used photoresist mixtures.

Another object of the present invention is to provide an improved light-sensitive resist material and method for making such a material, wherein the material contains a light-sensitive material having the above-desired advantages.

In accomplishing the foregoing objectives, there has been provided, in accordance with one aspect of the present invention, a light sensitive mixture comprising a polymeric binder that is insoluble in water but soluble or at least swellable in aqueous-alkaline solutions, and an o-naphthoquinonediazide-sulfonic acid ester, which is a 1,2-naphthoquinone-2-diazide-sulfonic acid ester of the formula I

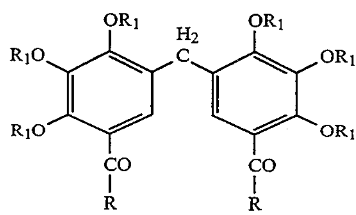

in which each R is independently hydrogen or an alkyl or aryl radical and each $R_1$ is independently hydrogen or a 1,2-naphthoquinone-2-diazide-4-sulfonyl, 1,2-naphthoquinone-2-diazide-5-sulfonyl or 7-methoxy-1,2-naphthoquinone-2-diazide-4-sulfonyl radical, the number of the identical or different naphthoquinone-diazide-sulfonyl radicals, defined as $R_1$, in the molecule being 1 to 5.

In accordance with another aspect of the present invention there is provided a light-sensitive mixture as described above, which additionally contains at least one o-naphthoquinone-diazide-sulfonic acid ester of the formula II

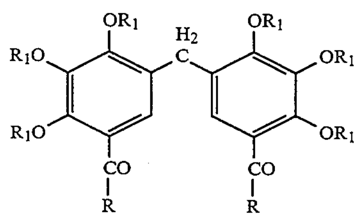

in which each R is independently hydrogen or an alkyl or aryl radical and each $R_1$ is independently a 1,2-naphthoquinone-2-diazide-4-sulfonyl; 1,2-naphthoquinone-2-diazide-5-sulfonyl; or 7-methoxy-1,2-naphthoquinone-2-diazide-4-sulfonyl radical.

In accordance with a further object of the present invention there has been provided a method of preparing a light-sensitive material comprising the steps of:

a) coating a base with one of the light-sensitive mixtures described above so as to form a light-sensitive layer on said base, b) exposing the light-sensitive layer through a mask, and c) developing the exposed layer.

Further objects, features, and advantages of the invention will become apparent from the detailed description of preferred embodiments that follows.

DETAILED DESCRIPTION OF THE PREFERRED EMBODIMENTS

The mixture according to the invention contains, as the 1,2-naphthoquinone-2-diazide-sulfonic acid ester, a compound of the formula I

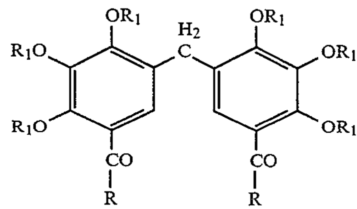

in which

R is hydrogen or an alkyl or aryl radical and $R_1$ is hydrogen or a 1,2-naphthoquinone-2-diazide-4-sulfonyl, 1,2-naphthoquinone-2-diazide-5-sulfonyl or 7-methoxy-1,2-napahthoquinone-2-diazide-4-sulfonyl radical, the number of the identical or different naphthoquinone diazide-sulfonyl radicals, defined as $R_1$, in the molecule being 1 to 5.

In the compound of structure I, the R groups may be the same or different and the $R_1$ groups may be the same or different. Preferably, both. R groups are the same and if more than one $R_1$ group is a naphthoquinone diazide sulfonyl radical, all of the naphthoquinone diazide sulfonyl radicals are the same.

According to the invention there is also provided a light-sensitive mixture of the type described above, which additionally contains at least one compound of the formula I which is completely esterified with o-naphthoquinonediazide-sulfonic acid. That is, none of the $R_1$ groups in formula I are hydrogen.

The alkyl radicals R can be straight-chain or branched and can be unsubstituted or substituted, for example, by halogen atoms or alkoxy groups. They preferably contain 1 to 20 carbon atoms. The aryl radicals R are preferably mononuclear and can be unsubstituted or substituted, for example, by alkyl or alkoxy groups or by halogen atoms.

Among the compounds of the formula I, those are preferred in which R is a hydrogen atom or a methyl or phenyl radical.

The stoichiometric degree of esterification of compound I is less than 100%, preferably between about 40 and 95% and particularly preferably between about 45 and 65%. If R is a methyl radical and $R_1$ is a 1,2-naphthoquinone-2-diazide-5-sulfonyl radical, the stoichiometric degree of esterification is preferably between about 50 and 65%. When R is a phenyl radical and $R_1$ is a 1,2-naphthoquinone-2-diazide-5-sulfonyl radical, the stoichiometric degree of esterification is preferably about 45 to 60%. If R is a methyl radical and $R_1$ is a 7-methoxy-1,2-naphthoquinone-2-diazide-4-sulfonyl radical, the stoichiometric degree of esterification is preferably in the range from about 70 to 95%.

The mixtures according to the invention are distinguished by a high light sensitivity, good developer resistance and good adhesion to metallic or non-metallic bases. Materials formed with these light-sensitive mixtures are additionally distinguished by their very rapid developability with aqueous, weakly alkaline solutions and by very high resistance to the alcohol-containing fountain solutions used in printing processes. Photoresists for microlithography, which are produced with the light-sensitive mixtures according to the invention, are especially distinguished by their high light sensitivity and development with pure tetramethylammonium hydroxide solutions, without leaving a residue, and impart high thermal stability to the developed resist structures.

The compounds of the formula I can be prepared in any suitable manner, such as by reacting 1 mol of 5,5'-diacyl-2,3,4,2',3',4'-hexahydroxydiphenylmethane with less than 6 mol of an activated o-naphthoquinonediazide-sulfonic acid derivative, for example, an o-naphthoquinonediazidesulfonic acid chloride. "Activated o-naphthoquinonediazide-sulfonic acid derivative" means any ortho-naphthoquinonediazide in which the sulfo group is chemically modified in such a way that it will readily react with phenolic hydroxy groups. Thus, for example, the reaction of 1 mol of 5,5'-diacyl-2,3,4,2',3',4'-hexahydroxydiphenylmethane with 5 mol of an o-naphthoquinonediazidesulfonic acid chloride leads to a product having a stoichiometric degree of esterification of 83.3%.

Mixtures of different o-naphthoquinonediazide-sulfonic acid chlorides can also be used for the esterification. The esterification procedure is generally carried out in an organic or aqueous-organic solvent in the presence of an acid acceptor.

Examples of suitable solvents are acetone, acetonitrile, dioxane, tetrahydrofuran, N-methylpyrrolidone, methylene chloride and others.

The acid acceptor can be inorganic, such as sodium carbonate or sodium bicarbonate, or organic. Among the organic acid acceptors, sodium salts of weak organic acids, such as sodium acetate, tertiary amines such as triethylamine, triethanolamine, N-methylmorpholine, 1,4-diaza-bicyclo[2.2.2]octane (®Dabco) or pyridine or pyridine derivatives, are particularly suitable.

Some of the o-naphthoquinonediazide-sulfonic acid esters according to the invention, of the indicated formula I, are listed in Table 1 which follows.

TABLE 1

| No. | R | $R_1$ | Molar degree of esterification (%)[1)] |
|---|---|---|---|
| 1 | H | $D_1$ | 66.6 |
| 2 | $CH_3$ | $D_1$ | 45.0 |
| 3 | $CH_3$ | $D_1$ | 50.0 |
| 4 | $CH_3$ | $D_1$ | 56.6 |
| 5 | $CH_3$ | $D_1$ | 58.3 |
| 6 | $CH_3$ | $D_1$ | 60.0 |
| 7 | $CH_3$ | $D_1$ | 66.6 |
| 8 | $CH_3$ | $D_1$ | 83.3 |
| 9 | $CH_3$ | $D_1$ | 95.0 |
| 10 | $CH_3$ | $D_2$ | 45.0 |
| 11 | $CH_3$ | $D_2$ | 53.3 |
| 12 | $CH_3$ | $D_2$ | 75.5 |
| 13 | $CH_3$ | $D_2$ | 83.3 |
| 14 | $CH_3$ | $D_3$ | 55.0 |
| 15 | $CH_3$ | $D_3$ | 66.6 |
| 16 | $CH_3$ | $D_3$ | 83.3 |
| 17 | $CH_3$ | $D_3$ | 91.6 |
| 18 | $C_2H_5$ | $D_1$ | 66.6 |
| 19 | $(CH_2)_6CH_3$ | $D_1$ | 66.6 |
| 20 | $(CH_2)_6CH_3$ | $D_1$ | 83.3 |
| 21 | $(CH_2)_{16}CH_3$ | $D_1$ | 58.3 |
| 22 | $C_6H_5$ | $D_1$ | 45.0 |
| 23 | $C_6H_5$ | $D_1$ | 50.0 |
| 24 | $C_6H_5$ | $D_1$ | 53.3 |
| 25 | $C_6H_5$ | $D_1$ | 60.0 |
| 26 | $C_6H_5$ | $D_1$ | 83.3 |
| 27 | $C_6H_5$ | $D_1$ | 95.0 |
| 28 | $C_6H_5$ | $D_2$ | 50.0 |
| 29 | $C_6H_5$ | $D_2$ | 83.3 |
| 30 | $C_6H_5$ | $D_2$ | 95.0 |
| 31 | $C_6H_5$ | $D_2$ | 45.0 |
| 32 | $C_6H_5$ | $D_3$ | 50.0 |
| 33 | $C_6H_5$ | $D_3$ | 66.6 |
| 34 | $C_6H_5$ | $D_3$ | 83.3 |
| 35 | $C_6H_5$ | $D_3$ | 95.0 |

TABLE 1-continued

| No. | R | $R_1$ | Molar degree of esterification (%)[1)] |
|---|---|---|---|
| | $C_6H_5$ | $D_3$ | |

$D_1$: 1,2-naphthoquinone-2-diazide-5-sulfonyl
$D_2$: 1,2-naphthoquinone-2-diazide-4-sulfonyl
$D_3$: 7-methoxy-1,2-naphthoquinone-2-diazide-4-sulfonyl
[1)]Stoichiometric degree of esterification, relative to the number (6) of the hydroxyl groups in the molecule of the phenolic base compound The 5,5'-diacyl-2,3,4,2',3',4'-hexahydroxydiphenylmethanes, preferably used as starting materials, are obtained in good yield by the preparation process described in EP-B 0,052,788, equivalent to U.S. Pat. No. 4,407,926, by reacting the corresponding 4-acylpyrogallols with aqueous formalin solution (38% by weight) at 80°-100° C. in the presence of acidic catalysts such as hydrochloric acid or p-toluenesulfonic acid. If necessary for dissolving the 4-acylpyrogallols, an organic solvent is added, for example, aliphatic short-chain alcohols or glycol half-ethers.

The 4-acylpyrogallols are known from the literature and can be prepared by the processes described therein or by an analogous process. Some of these compounds $C_6H_2(OH)_3$—CO—R are compiled in Table 2 which follows.

TABLE 2

| R | m.p. (°C.) | | Ref. |
|---|---|---|---|
| H | 159-161 | Light yellow platelets | 1 |
| $CH_3$ | 167-169 | " | 2 |
| $C_2H_5$ | 126-128 | Colorless needles | 3 |
| $(CH_2)_2CH_3$ | 100-102 | " | 4 |
| $(CH_2)_4CH_3$ | 86-87 | " | 3 |
| $(CH_2)_6CH_3$ | 73-74 | " | 5 |
| $(CH_2)_8CH_3$ | 77-79 | " | 3 |
| $(CH_2)_{16}CH_3$ | 91-93 | " | 5 |
| $C_6H_5$ | 139-142 | Light Yellow needles | 6 |

1) H. Gross, A. Rieche, G. Matthey, Chem. Ber. 96, 308 (1963)
2) I. C. Badhwar, K. Venkataraman, Org. Syntheses, Coll. Vol II/304
3) NG. PH. Buu-Hoi; J. Org. Chem. 18, 1723 (1953)
4) W. Campbell, G. M. Coppingen, J. Am. soc. 73, 2708 (1951)
5) R. D. Haworth, D. Woodcock, J. Chem. Soc. 1946, II, 999
6) Commercial product from Riedel de Häen, Germany Some of the 5,5'-diacyl-2,3,4,2',3',4'-hexahydroxydiphenylmethanes useful as starting materials are listed in Table 3 which follows.

TABLE 3

| R | m.p. (°C.) | | Yield % |
|---|---|---|---|
| H | >250 (decomp) | Colorless powder | 65 |
| $CH_3$ | 246-248 | Light yellow powder | 94 |
| $C_2H_5$ | 234-236 | Colorless powder | 68 |
| $(CH_2)_2CH_3$ | 180-182 | " | 65 |
| $(CH_2)_4CH_3$ | 169-171 | " | 62 |
| $(CH_2)_6CH_3$ | 157-159 | " | 61 |
| $(CH_2)_8CH_3$ | 147-158 | " | 67 |
| $(CH_2)_{16}CH_3$ | 137-139 | " | 65 |
| $C_6H_5$ | 227-228 | Light yellow needles | 83 |

The concentration of the o-naphthoquinonediazide-sulfonic acid esters of the formula I, according to the invention, in the light-sensitive mixture or light-sensitive layer can vary within relatively wide limits depending on the intended use of the mixture. In general, the content is about 3 to 50, preferably about 7 to 30% by weight, relative to the content of non-volatile constituents.

As mentioned at the outset, the light-sensitive mixtures according to the invention contain a polymeric, water-insoluble resinous binder which dissolves in the solvents used for the mixture according to the invention and is also soluble or at least swellable in aqueous alkalis.

The novolak condensation resins, useful in many positive resist materials based on naphthoquinonediazides, have also proved to be particularly useful and advantageous in the mixtures according to the invention. They promote the sharp differentiation between exposed and unexposed layer parts during development, particularly the more highly condensed resins with substituted phenols, for example, cresols and xylenols, as the partners for the condensation with formaldehyde. Preferably, the light-sensitive mixture therefore contains a phenolic resin novolak as alkali-soluble binder.

The following are also suitable as binders: polyhydroxystyrene, substituted polyhydroxystyrenes and poly(pyrocatechol methacrylate). Natural resins, such as shellac and colophony, and synthetic resins, such as copolymers of styrene and maleic anhydride or copolymers of acrylic acid or methacrylic acid, especially with acrylic or methacrylic acid esters, are mentioned as further useful alkali-soluble or alkali-swellable binders. Resins containing succinimide groups or sulfonamide groups can also be used.

The nature and quantity of the alkali-soluble resin can differ depending on the application; proportions of total solids of between about 50 and about 97, particularly preferably 70–93 percent by weight are preferred. In addition to the binders mentioned above, numerous further resins can also be used in the mixture, including epoxides and vinyl polymers such as polyvinyl acetates, polyacrylates, polyvinyl acetals, polyvinyl ethers, polyvinylpyrrolidones and the copolymers of the monomers on which they are based. The most advantageous proportion of these resins depends on the technological requirements of the application and on the influence on the development conditions, and in general it amounts to not more than about 20 percent by weight of the alkali-soluble resin.

In small quantities, the light-sensitive mixture can also contain substances such as polyglycols, cellulose derivatives such as ethylcellulose, wetting agents, dyes, adhesion promoters, crosslinking agents and finely disperse pigments as well as, if required, UV absorbers, for special requirements such as flexibility, adhesion and gloss, coloring and color change, and the like.

For coating a suitable base, the mixtures are generally dissolved in a solvent. The selection of the solvents must be matched to the intended coating method, the layer thickness and the drying conditions. Suitable solvents for the mixture according to the invention are ketones such as methyl ethyl ketone, cyclopentanone and cyclohexanone, chlorinated hydrocarbons such as trichloroethane and 1,1,1-trichloroethane, alcohols such as n-propanol, ethers such as tetrahydrofuran, glycol half-ethers such as ethylene glycol monoethyl ether and propylene glycol monomethyl ether, alcohol ether-acetates such as propylene glycol methyl ether-acetate, and esters such as ethylacetate and butylacetate, as well as aromatic hydrocarbons such as toluene and xylene. Mixtures can also be used which, in addition, can contain solvents such as acetonitrile, dioxane or dimethylformamide for special purposes. In principle, all solvents can be used which do not irreversibly react with the layer components. Glycol half-ethers, especially ethylene glycol monomethyl ether and propylene glycol monomethyl ether and also glycol ether-acetates such as propylene glycol monomethyl ether-acetate, are particularly preferred. A coating solution for producing a photoresist is preferably of such a nature that the total content of non-volatile constituents dissolved in the solvent or solvent mixture is about 15 to 40 percent by weight.

The invention also relates to a light-sensitive resist material composed of a base and a light-sensitive layer containing a mixture as described above. In most cases, metals are used as bases for light-sensitive layers having a thickness of less than about 10 $\mu m$. For offset printing plates, especially bright-rolled, mechanically or electrochemically toughened and, if appropriate, anodized aluminum is used, which can additionally have been chemically pretreated, for example, with polyvinylphosphonic acid, silicates, phosphates, hexafluorosilicates or with hydrolyzed tetraethyl orthosilicate. In addition, multi-metal plates, such as plates composed of Al/Cu/Cr or of brass/chromium, can be used. For producing letterpress printing plates, the mixtures according to the invention can be applied to zinc plates or magnesium plates or to commercially available microcrystalline alloys thereof for powderless etching processes, and also to etchable plastics such as polyoxymethylene. The mixtures according to the invention are suitable for gravure printing forms or screen printing forms, due to their good adhesion and etching resistance on copper surfaces and nickel surfaces. Likewise, the mixtures according to the invention can be used as photoresists in the manufacture of printed circuit boards and in chemical milling. Suitable bases for photoresists which are used for wafers in microlithography are, for example, silicon, silica, doped silica, silicon nitride, polysilicon, aluminum, aluminum alloys, copper, tantalum or polymeric resins. For further applications, other bases such as wood, paper, ceramics, textiles, plastics and other metals can also be considered.

Preferred bases for thick layers of more than 10 $\mu m$ are plastic films, which are then used as temporary supports for transfer layers. For this purpose, and for color test foils, polyester films are preferably used, for example those of polyethylene terephthalate. Polyolefin films such as polypropylene are also suitable.

The coated base is then exposed and developed by means known in the art, any exposure and development methods being useful.

The coating of the base is carried out in any known manner, such as by whirler-coating, spraying, dipping, rolling, by means of slot dies, blades or by curtain coating. Finally, the coating of printed circuit boards, glass or ceramics and silicon wafers can also be carried out by layer transfer from a temporary base.

The exposure is carried out with light sources conventional in industry. Exposure to electron beams or laser beams is a further imaging possibility.

The total alkali content of the aqueous solutions used for development is generally about 1 mol/l, but preferably between about 0.2 and 0.7 mol/l.

The developers can also contain minor quantities of organic solvents or wetting agents. After exposure, the light-sensitive layer areas struck by light are removed, thereby to produce a positive image of the original. In the so-called "image reversal process", the latent copy is subjected to a heat treatment after the imagewise exposure. The whole area is then exposed and developed, so that the areas struck by light during the second exposure of the whole area are removed by the developer. A negative image of the original is obtained in this way.

Preferred applications of the light-sensitive mixtures according to the invention are in the production of printing forms, i.e., especially for offset printing forms, halftone gravure printing and screen printing forms, for photoresists in microlithography and for so-called dry resists for the manufacture of printed circuit boards.

The recording materials produced using the mixtures according to the invention have a high light sensitivity in practice and very good developer resistance to alkaline developers. They can also be developed rapidly and without problems with aqueous, weakly alkaline solutions. They are, however, also outstandingly developable, without leaving a residue, with aqueous tetramethylammonium hydroxide solutions which need not contain any further development-promoting additives.

Printing forms produced with these light-sensitive mixtures have a high resistance to alcohol-containing fountain solutions, such as are presently conventionally used during the printing process on printing presses.

Photoresists in microlithography, which are produced with these light-sensitive mixtures, are distinguished by high light sensitivity and high thermal stability of the developed resist structures.

The preferred compounds of formula I are themselves distinguished by good solubility in the usual solvents used for the coating of bases and, in addition, show a pronounced oleophilic character. The compounds are also highly compatible with the other constituents of the light-sensitive layer.

The invention is explained in more detail by reference to the examples which follow, in which parts by weight (p.b.w.) and parts by volume (p.b.v.) are in the same relationship as the g and the ml. Percentages are percent by weight, unless otherwise stated.

SYNTHESIS EXAMPLE

The preparation of compounds of the formula A is described in more detail below.

3.48 g (0.01 mol) of 5,5'-diacetyl-2,3,4,2',3',4'-hexahydroxydiphenylmethane and 13.43 g (0.05 mol) of 1,2-naphthoquinone-2-diazide-5-sulfonyl chloride are dissolved in a solvent mixture of 150 ml of acetone and 70 ml of N-methyl-2-pyrrolidone at 20°–24° C., and 10.1 g (0.1 mol) of N-methyl-morpholine are added dropwise to the yellow solution, the temperature of the reaction mixture rising to 29°–31° C. To complete the reaction, stirring is continued for 35 minutes. The end point of the reaction has been reached as soon as 1,2-naphthoquinone-2-diazide-5-sulfonyl chloride is no longer detectable (check by thin-layer chromatography [TLC]). The brown solution is then added dropwise with vigorous stirring to a mixture of 1.5 l of water and 15 ml of 37% hydrochloric acid in the course of 40–45 minutes. The light yellow amorphous precipitate is filtered off with suction, washed on the suction filter with 500 ml of water and dried for 48 hours in a vacuum drying cabinet at 30°–40° C./250 mm(hg) to constant weight.

Yield: 14.75 g (=97.6% of theory); stoichiometric degree of esterification: 83.3% (compound 8 from Table A); content of 5,5'-diacetyl-2,3,4,2',3',4'-hexahydroxydiphenylmethane hexa-ester: 70.14% (determined by high-pressure liquid chromatography [HPLC]).

By the same procedure, compound No. 23 from Table A is obtained, with the only difference that, in place of 5,5'-diacetyl-2,3,4,2',3',4'-hexahydroxydiphenylmethane, 4.72 g (0.01 mol) of 5,5'-dibenzoyl-2,3,4,2',3',4'-hexahydroxydiphenylmethane, 8.06 g (0.03 mol) of 1,2-naphthoquinone-2-diazide-5-sulfonyl chloride and 3.6 g (0.0032 mol) of 1,4-diaza-bicyclo[2.2.2]octane (®Dabco) as HCl acceptor are used.

Yield: 10.78 g=92.3% of theory); stoichiometric degree of esterification: 50%; content of 5.5'-dibenzoyl-2,3,4,2',3',4'-hexahydroxydiphenylmethane: 31.0% (HPLC).

The compounds listed in Table A were prepared analogously, the corresponding 5,5'-diacyl-2,3,4,2',3',4'-hexahydroxydiphenylmethanes (Table 3) and the o-naphthoquinonediazidesulfonyl chlorides being used in the stoichiometrically calculated quantity in order to obtain the desired degree of esterification.

If triethylamine or triethanolamine is used as the acid acceptor, compounds having a similar ester distribution and comparable hexa-ester content are obtained.

O-naphthoquinonediazide-sulfonic acid esters 01–03 from Table A having a stoichiometric degree of esterification of 100% used in the comparative examples were synthesized by esterifying 5,5'-diacetyl-2,3,4,2',3',4'-hexahydroxydiphenylmethane or 5,5'-dibenzoyl-2,3,4,2',3',4'-hexahydroxydiphenylmethane with 6 mol of 1,2-naphthoquinone-2-diazide-5-sulfonic acid chloride (compounds 01 and 02) or, respectively, by esterifying 2,3,4-trihydroxybenzophenone with 3 mol of 7-methoxy-1,2-naphthoquinone-2-diazide-4-sulfonic acid chloride (compound 03) analogously to the procedure used for the compounds according to the invention. The known compound 04 was obtained in the same way by partial esterification of 2,3,4-trihydroxybenzophenone with 1.4 mol of 1,2-naphthoquinone-2-diazide-5-sulfonic acid chloride.

TABLE A

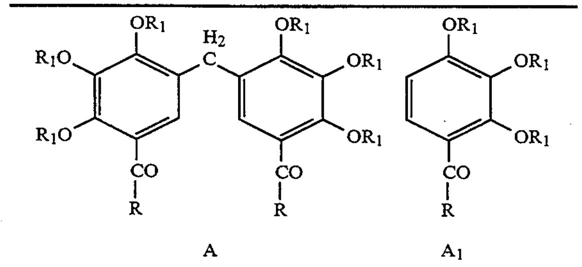

$R_1$ is 1,2-naphthoquinone-2-diazide-5-sulfonyl ($D_1$), 1,2-naphthoquinone-2-diazide-4-sulfonyl ($D_2$) or 7-methoxy-1,2-naphthoquinone-2-diazide-4-sulfonyl $D_3$)

| No. | R | $R_1$ | Molar degree of esterification (%)[1] | Formula |
|---|---|---|---|---|
| 1 | H | $D_1$ | 66.6 | A |
| 2 | $CH_3$ | $D_1$ | 40.0 | A |
| 4 | $CH_3$ | $D_1$ | 56.6 | A |
| 8 | $CH_3$ | $D_1$ | 83.3 | A |
| 11 | $CH_3$ | $D_2$ | 53.3 | A |
| 13 | $CH_3$ | $D_2$ | 83.3 | A |
| 16 | $CH_3$ | $D_3$ | 83.3 | A |
| 17 | $CH_3$ | $D_3$ | 91.6 | A |
| 18 | $C_2H_5$ | $D_1$ | 66.6 | A |
| 22 | $C_6H_5$ | $D_1$ | 40.0 | A |
| 23 | $C_6H_5$ | $D_1$ | 50.0 | A |
| 26 | $C_6H_5$ | $D_1$ | 83.3 | A |
| 28 | $C_6H_5$ | $D_2$ | 50.0 | A |
| 29 | $C_6H_5$ | $D_2$ | 83.3 | A |
| 01 | $CH_3$ | $D_1$ | 100.3 | A |
| 02 | $C_6H_5$ | $D_1$ | 100.0 | A |
| 03 | $C_6H_5$ | $D_3$ | 100.0 | $A_1$ |
| 04 | $C_6H_5$ | $D_1$ | 40.0 | $A_1$ |

1)Stoichiometric degree of esterification

1) Stoichiometric degree of esterification

The superior properties of the compounds 1, 4, 8, 11, 13, 16, 17, 18, 23, 26, 28 and 29, according to the invention, from Table A, which are identical to the corresponding compounds of Table 1, as compared with the known compounds 01–04 and the compounds 2 and 22 of Table A are demonstrated in the examples which follow.

EXAMPLE 1

A 0.3 mm thick aluminum foil, electrolytically roughened in hydrochloric acid ($R_z$ value according to DIN 4768: 5.0 l), interstage-pickled in sulfuric acid and anodized in sulfuric acid (oxide weight 4.0 g/m$^2$) is rendered hydrophilic with polyvinylphosphonic acid according to DE-A 1,621,478 and then coated on a whirler with the following resist solution:

5.00% by weight of a cresol/formaldehyde novolak resin having a hydroxyl number of 420 according to DIN 53783/53240 and a weight-average value of 10,000 by GPC (polystyrene standard),
M % by weight of naphthoquinonediazide compound corresponding to Table A/1,
0.15% by weight of 1,2-naphthoquinone-2-diazide-4-sulfonyl chloride,
0.05% by weight of Victoria pure blue (C.I. 44,045) and
to make up to 100% by weight of a 40/60 solvent mixture of methyl ethyl ketone and propylene glycol monomethyl ether.

The resist film is dried for 1 minute at 125° C. The film weight is 2.0 g/m$^2$.

The following test criteria were rated during the further processing of the planographic printing plates produced:

Light sensitivity (LE):

The plates were exposed to a 5 kW metal halide-doped mercury vapor lamp at a distance of 110 cm under a UGRA offset test wedge 1982 as an original for 45 seconds and then immersed for 30 seconds in the following developer:

| | |
|---|---|
| Potassium silicate | 2.7% by weight |
| Potassium disilicate | 1.0% by weight |
| Tripotassiumphosphate | 0.5% by weight |
| Triethylene glycol | 0.1% by weight |
| Water | 95.7% by weight |

The total alkali content of the developer is 0.53 mol/l.

The open halftone step of the test wedge is determined, i.e., that step which is the first where the optical density, measured densitometrically with cyan filter, is less than or equal to 0.01.

Developer resistance (ER):

The number of halftone steps is determined, by which the wedge reproduction becomes more open in the case of a development time extended by 4 minutes under otherwise identical conditions.

Isopropanol resistance (IR):

The unexposed plates are subjected for 1 minute to the following test solution:

| | |
|---|---|
| Isopropanol | 49% by weight |
| Phosphoric acid | 2% by weight |
| Water | 49% by weight |

The percentage layer removal in the test solution is determined.

The following apply in Table A/1:

$R_1$ number of 1,2-naphthoquinone-2-diazide-5-sulfonyl radicals,
VG stoichiometric degree of esterification,
M diazo quantity, determined in a concentration series, to achieve an open step 5 in the LE test (see above),
1) comparison corresponding to DE-C 938,233,
2) comparison corresponding to EP-B 052,788

TABLE A/1

| Example | Compound No. | Formula | R | $R_1$ | VG % | M | ER | IR |
|---|---|---|---|---|---|---|---|---|
| 1-1 | 04 | $A_1$ | Phenyl | 1.2 | 40 | 1.30 | 2.5 | 82 1) |
| 1-2 | 02 | A | " | 6.0 | 100 | 0.45 | 4.0 | 92 2) |
| 1-3 | 23 | A | " | 3.0 | 50 | 1.15 | 2.5 | 20 |

The results according to Table A/1 show that, with the naphthoquinonediazide 23 according to the invention, an improvement in the isopropanol resistance of positive resist films, which are adjusted to processability with weakly alkaline developers, is possible while maintaining the light sensitivity.

EXAMPLE 2

A 0.3 mm thick aluminum foil, electrolytically roughened in nitric acid (Rz value according to DIN 4768: 2.8 μm) and anodized in sulfuric acid (oxide weight 3.0 g/m$^2$), is rendered hydrophilic with polyvinylphosphonic acid according to DE-A 1,621,478 and then coated on a whirler with the following resist solution:

5.00% by weight of a cresol/formaldehyde novolak resin having a hydroxyl number of 420 according to DIN 53783/53240 and a weight average value of 10,000 according to GPC (polystyrene standard),
M % by weight of a naphthoquinonediazide compound according to Table A/2,
0.15% by weight of 1,2-naphthoquinone-2-diazide-4-sulfonyl chloride,
0.08% by weight of Victoria pure blue (C.I. 44,045) and to make up to 100% by weight of a 55/45 solvent mixture of tetrahydrofuran and propylene glycol monomethyl ether.

The resist film is dried for 1 minute at 125° C. The film weight is 2.2 g/m$^2$.

In the further processing of the planographic printing plates produced, the same test criteria as in Example 1 are rated.

The following apply in Table A/2:

$R_1$ number of 1,2-naphthoquinone-2-diazide-5-sulfonyl radicals,
VG stoichiometric degree of esterification,
M a diazo quantity, determined in a concentration series, to reach an open stage 5 in the LE test (see above),
1) comparison according to DE-C 938,233 (formula $A_1$)

TABLE A/2

| Example | Compound No. | Formula | R | $R_1$ | VG % | M | ER | IR |
|---|---|---|---|---|---|---|---|---|
| 2-1 | 04 | $A_1$ | Phenyl | 1.2 | 40 | 1.30 | 2.5 | 82 1) |
| 2-2 | 1 | A | Hydrogen | 4.0 | 66.6 | 1.20 | 3.5 | 7 |
| 2-3 | 4 | A | Methyl | 3.4 | 56.6 | 1.60 | 3.0 | 2 |
| 2-4 | 18 | A | Ethyl | 4.0 | 66.6 | 1.10 | 2.5 | 25 |

The results with the naphthoquinonediazides 1, 4 and 18 from Table A/2, according to the invention, confirm the result of the improved isopropanol resistance from Example 1.

EXAMPLE 3

A 0.3 mm thick aluminum foil, electrolytically roughened in hydrochloric acid (Rz value according to DIN 4768: 4.2 1 m), interstage-pickled in sulfuric acid and anodized in sulfuric acid (oxide weight 3.0 g/m$^2$), is rendered hydrophilic with polyvinylphosphonic acid according to DE-A 1,621,478 and then coated with the following resist solution:

4.80% by weight of a cresol/formaldehyde novolak resin having a hydroxyl number of 420 according to DIN 53783/53240 and a weight-average value of 10,000 according to GPC (polystyrene standard), M % by weight of a 1,2-naphthoquinone-2-diazide-4-sulfonyl compound according to Table A/3 (M).

0.05% by weight of 2-(4-styrylphenyl)-4,6-bis-trichloromethyl-s-triazine, 0.10% by weight of crystal violet (C.I. 42,555) and to make up to 100% by weight of a 55/45 solvent mixture of tetrahydrofuran and propylene glycol monomethyl ether.

The resist film is dried for 1 minute at 125° C. The film weight is 1.8 g/m$^2$.

In this example, the suitability of the naphthoquinone diazide compounds according to the invention for reversal processing, i.e., the positive-negative conversion, is tested.

For this purpose, the plates are exposed as in Example 1, then heat treated for 2 minutes in an oven at 135° C., fully exposed without an original after cooling and developed for 30 seconds in the developer from Example 1. With the planographic printing plates thus produced, a print run test is carried out in a sheet-fed offset printing press with an alcohol fountain unit at an isopropanol content of the fountain solution of 25%.

The results are compiled in Table A/3.

The following apply in Table A/3:

$R_1$ number of the 1,2-naphthoquinone-2-diazide-4-sulfonyl radicals,

VG stoichiometric degree of esterification,

M diazo quantity employed,

LE light sensitivity, i.e., the fully covered step of the UGRA offset test wedge, DRA length of print run in the alcohol fountain unit, 1) Comparison according to DE-C 938,233 (formula $A_1$)

TABLE A/3

| Example | Compound No. | Formula | R | $R_1$ | VG | M | LE | DRA |
|---|---|---|---|---|---|---|---|---|
| 3-1 | 04 | $A_1$ | phenyl | 1.2 | 40 | 1.30 | 2 | 70000 1) |
| 3-2 | 11 | A | methyl | 3.2 | 53.3 | 1.20 | 2 | 80000 |
| 3-3 | 28 | A | phenyl | 3.0 | 50 | 1.2 | 2 | 80000 |

The results in Table A/3 show that reversal processing is also possible with the naphthoquinone diazides 11 and 28 according to the invention and that the print run performance in alcohol fountain units is superior to that of the planographic printing plates produced with the known naphthoquinone diazide compound 04.

EXAMPLE 4

Solubility

The solubility of the photoactive compound according to the invention is determined in a 25% solution of cresol/xylenol novolak in 1-methoxy-2-propyl acetate (PGMEA), since the resulting solutions correspond far more closely to the reality of a photoresist mixture than the solutions of the compounds according to the invention in pure PGMEA.

Saturated solutions of these compounds are prepared by adding an excess of the photoactive compound to the novolak solution indicated. The UV absorption of these solutions at $\lambda_{max}$ is established and the concentration of the saturated solutions is determined by comparison with a UV calibration straight line, obtained from dilute solutions of the corresponding compounds.

In this way, the solubility of compound 8 is found to be 28% (relative to the solids content of the solution), the solubility of compound 13 is found to be 46%, the solubility of compound 17 is found to be 45% and the solubility of compound 29 is found to be 39%, whereas the solubility of the comparison compound 01 is only 22%.

Since the highest possible content of photoactive compound is desired in high-resolution photoresist formulations, the solubility of this component is important.

EXAMPLE 5

Light Sensitivity 33.3% by weight, relative to the solids content of the novolak solution, of the photoactive compound 16, 17 and 03 from Table A are dissolved in a 21% strength solution of a cresol/xylenol novolak in 1-methoxy-2-propyl acetate (PGMEA).

Using these resist solutions, silicon wafers are coated by whirler-coating, and the layers thus obtained are dried for 45 seconds on a hotplate at a temperature of 100° C. The layer thickness is 1.25 μm.

This is followed by the exposure of the photoresist on the wafer in different exposure dosages to the g line of the light of a mercury high-pressure lamp from an exposure apparatus usual in industry (g line stepper).

The wafers thus exposed are then subjected to a further heat treatment at 120° C. for 45 seconds and then developed for 30 seconds in an aqueous solution of tetramethyl-ammonium hydroxide (N=0.27 mol/l). The exposed areas are developed at different rates corresponding to their exposure dosage. The required energy dosage at the exposure area just fully developed, the so-called opening point, is compared.

To reach the opening point, the resist layer containing compound 17 requires 42 mJ/cm$^2$, the resist layer with compound 16 requires 58 mJ/cm$^2$ and the resist layer with the comparison compound 03 requires 92 mJ/cm$^2$. This corresponds to an increase in the light sensitivity, defined as the reciprocal of the energy requirement, by 119% in the case of compound 17 and by 59% in the case of compound 16.

Under analogous conditions—only the developing time was extended to 50 seconds—a series of further light-sensitive solutions were compared, the exposure of the photoresists being carried out with the i line of the light of a mercury high-pressure lamp from an exposure apparatus usual in industry (i-line stepper). To reach the opening point, the resist layer containing compound 13 required 30 mJ/cm$^2$, the resist layer with compound 16 required 40 mJ/cm$^2$, the resist layer with compound 29 required 58 mJ/cm$^2$ and the resist layer with the comparison compound 03 required 69 mJ/cm$^2$. This corresponds to an increase in the light sensitivity, defined as the reciprocal of the energy requirement, by 130% in the case of compound 13, by 73% in the case of compound 16 and by 19% in the case of compound 29.

EXAMPLE 6

Thermal Stability

Silicon wafers were coated by whirler-coating with the resist solutions from Example 5, and the layers thus obtained were dried for 45 seconds on a hotplate heated to 90° C. The layer thickness was 1.25 μm. After exposure to light of wavelengths=436 nm, using an exposure apparatus usual in industry, through a mask containing structures of different dimensions, the wafers are subjected to a repeated heat treatment for 45 seconds on a hotplate heated to 100° C.

Subsequently, the layer areas struck by light are removed by means of an aqueous solution of tetramethylammoniumhydroxide (N=0.24 mol/l) (developing time 30 seconds), so that the unexposed area sections remain on the silicon disk.

To test the heat stability of the structures, the silicon wafers processed in this way are each subjected for 60 seconds to temperatures of 120° C., 125° C., 130° C. and 135° C. in each case and then evaluated in a scanning electron microscope.

The comparative examinations showed that structure-stable 2 μm lines are achievable up to a temperature of 130° C. with the resist solution of the photoactive compound 16 according to the invention, whereas the 2 μm lines are structure-stable only up to a temperature of 120° C. when the resist solution with the comparison compound 03 is used.

EXAMPLE 7

A 0.3 mm thick aluminum foil, electrolytically roughened in nitric acid ($R_z$ value according to DIN 4768: 2.8 μm) and anodized in sulfuric acid (oxide weight 3.0 g/m$^2$), is rendered hydrophilic with polyvinylphosphonic acid according to DE-A 1,621,478 and then coated on a whirler with the following resist solution:

5.00% by weight of a cresol-formaldehyde novolak resin having a hydroxyl number of 420 according to DIN 53783/53240 and a weight-average value of 10,000 according to GPC (polystyrene standard), M % by weight of a naphthoquinone diazide compound corresponding to Table A/4, 0.15% by weight of 1,2-naphthoquinone-2-diazide-4-sulfonyl chloride, 0.08% by weight of Victoria Pure Blue (C.I. 44,045) and to make up to 100% by weight of a 55/45 solvent mixture of tetrahydrofuran and propylene glycol monomethyl ether.

The resist film is dried for 1 minute at 125° C. The film layer weight is 2.2 g/m$^2$.

In the further processing of the planographic printing plates produced, the same test criteria as in Example 1 are rated.

The following apply in the Table A/4:

$R_1$ number of the 1,2-naphthoquinone-2-diazide-5-sulfonyl radicals,

VG stoichiometric degree of esterification,

M diazo quantity employed

TABLE A/4

| Example | Compound No | Formula | R | $R_1$ | VG | M | LE | ER | IR |
|---|---|---|---|---|---|---|---|---|---|
| 7-1 | 2 | A | methyl | 2.7 | 40 | 1.30 | 5 | >8 | 30 |
| 7-2 | 22 | A | phenyl | 2.7 | 40 | 1.30 | 5 | >8 | 29 |

Example 7 shows that the resist layers produced with the naphthoquinone diazides 2 and 22 show a sufficient light sensitivity but a developer resistance and isopropanol resistance which is hardly acceptable. Accordingly, these diazides, although within the scope of the present invention, are not preferred in the present invention.

What is claimed is:

1. A light-sensitive mixture comprising a polymeric binder that is insoluble in water but soluble or at least swellable in aqueous-alkaline solutions, and a 1,2-naphthoquinone-2-diazide-sulfonic acid ester of the formula I

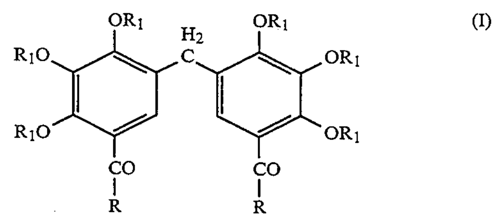

in which each R is independently hydrogen or an alkyl or aryl radical and each $R_1$ is independently hydrogen or a 1,2-naphthoquinone-2-diazide-4-sulfonyl; 1,2-naphthoquinone-2-diazide-5-sulfonyl; or 7-methoxy-1,2-naphthoquinone-2-diazide-4-sulfonyl radical, wherein the number of the identical or different naphthoquinone-diazide-sulfonyl radicals, defined as $R_1$, in the molecule is 1 to 5, with the proviso that if each R is methyl, then no more than four of the $R_1$'s are 1,2-naphthoquinone-2-diazide-5-sulfonyl.

2. A light-sensitive mixture as claimed in claim 1, wherein each R is a straight-chain or branched alkyl radical containing 1 to 20 carbon atoms.

3. A light-sensitive mixture as claimed in claim 1, wherein each R is a straight-chain or branched alkyl radical containing 1 to 20 carbon atoms, which is substituted with one or more of a halogen atom or alkoxy group.

4. A light-sensitive mixture as claimed in claim 1, wherein each R is an aryl radical.

5. A light-sensitive mixture as claimed in claim 1, wherein each R is an aryl radical substituted with at least one of an alkyl or alkoxy group or halogen atom.

6. A light-sensitive mixture as claimed in claim 1, wherein each R is hydrogen.

7. A light-sensitive mixture as claimed in claim 1, wherein each R is a methyl or phenyl radical.

8. A light-sensitive mixture as claimed in claim 1, which additionally contains at least one o-naphthoquinone-diazide-sulfonic acid ester of the formula II

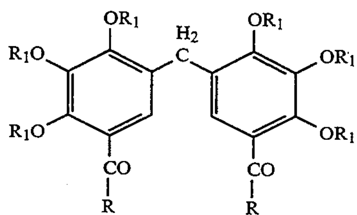

(II)

in which each R is independently hydrogen or an alkyl or aryl radical and each $R_1$ is independently a 1,2-naphthoquinone-2-diazide-4-sulfonyl; 1,2-naphthoquinone-2-diazide-5-sulfonyl; or 7-methoxy-1,2-naphthoquinone-2-diazide-4-sulfonyl radical.

9. A light-sensitive mixture as claimed in claim 1, wherein the o-naphthoquinonediazide-sulfonic acid esters of the formula I have been obtained by reacting 5,5'-diacyl-2,3,4,2',3',4'-hexahydroxydiphenylmethane with less than 6 equivalents of an activated o-naphthoquinonediazide-sulfonic acid derivative.

10. A light-sensitive mixture as claimed in claim 1, wherein the stoichiometric degree of esterification of the compound of Formula I is about 40 to about 95%.

11. A light-sensitive mixture as claimed in claim 1, wherein each R is a methyl radical, and each $R_1$ is a 1,2-naphthoquinone-2-diazide-5-sulfonyl radical and the stoichiometric degree of esterification of compound I is between about 50 and about 65%.

12. A light-sensitive mixture as claimed in claim 1, wherein each R is a phenyl radical, and each $R_1$ is a 1,2-naphthoquinone-2-diazide-5-sulfonyl radical and the stoichiometric degree of esterification of compound I is between about 45 and about 60%.

13. A light-sensitive mixture as claimed in claim 1, wherein each R is a methyl radical, and each $R_1$ is a 7-methoxy-1,2-naphthoquinone-2-diazide-4-sulfonyl radical and the stoichiometric degree of esterification of compound I is between about 70 and about 95%.

14. A light-sensitive mixture as claimed in claim 1, wherein the polymeric binder comprises a phenolic novolak resin.

15. A light-sensitive mixture as claimed in claim 1, comprising about 3 to about 50% by weight of the 1,2-naphthoquinone-2-diazide-sulfonic acid ester of the formula I, relative to the total weight of the non-volatile constituents in the mixture.

16. A light-sensitive resist material containing a base and a light-sensitive layer, wherein the layer comprises a mixture as claimed in claim 1.

17. A light-sensitive material as claimed in claim 16, wherein the base comprises aluminum having a surface that has been roughened mechanically or electrochemically and optionally anodically oxidized.

18. A light-sensitive material as claimed in claim 16, wherein the base comprises a polyester film.

19. A method of preparing a light-sensitive material as claimed in claim 16, comprising the steps of:

a) coating said base with said mixture so as to form a light-sensitive layer on said base, b) exposing the light-sensitive layer through a mask, and c) developing the exposed layer.

20. A method as claimed in claim 19, wherein said step c) comprises developing the exposed layer with an aqueous solution having an alkaline content of between about 0.2 and 0.7 mol/l.

21. A light-sensitive mixture as claimed in claim 1, wherein the R's are independently hydrogen, an alkyl radical, an unsubstituted aryl radical, or an aryl radical substituted only with one or more substituents selected from the group consisting of alkyl, alkoxy, and halogen.

22. A light-sensitive mixture as claimed in claim 1, wherein each R is independently hydrogen or an aryl group.

23. A light-sensitive mixture as claimed in claim 1, wherein at least on $R^1$ is one of the 4-sulfonyl radicals.

* * * * *